(12) United States Patent
Briano et al.

(10) Patent No.: US 11,320,466 B1
(45) Date of Patent: May 3, 2022

(54) DIFFERENTIAL CURRENT SENSOR

(71) Applicant: Allegro MicroSystems, LLC, Manchester, NH (US)

(72) Inventors: Robert A. Briano, Auburn, NH (US); Wade Bussing, Manchester, NH (US); Timothy A. Clark, Clarkston, MI (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/083,487

(22) Filed: Oct. 29, 2020

(51) Int. Cl.
*G01R 19/10* (2006.01)
*G01R 19/15* (2006.01)

(52) U.S. Cl.
CPC ............. *G01R 19/10* (2013.01); *G01R 19/15* (2013.01)

(58) Field of Classification Search
None
See application file for complete search history.

(56) References Cited

U.S. PATENT DOCUMENTS

| | | | |
|---|---|---|---|
| 6,424,018 B1 | 7/2002 | Ohtsuka | |
| 6,462,531 B1 | 10/2002 | Ohtsuka | |
| 6,545,457 B2 | 4/2003 | Goto et al. | |
| 6,683,448 B1 | 1/2004 | Ohtsuka | |
| 6,727,683 B2 | 4/2004 | Goto et al. | |
| 6,759,841 B2 | 7/2004 | Goto et al. | |
| 6,791,313 B2 | 9/2004 | Ohtsuka | |
| 6,812,687 B1 | 11/2004 | Ohtsuka | |
| 6,841,989 B2 | 1/2005 | Goto et al. | |
| 6,921,955 B2 | 7/2005 | Goto | |
| 7,598,601 B2 | 10/2009 | Taylor et al. | |
| 7,816,905 B2 | 10/2010 | Doogue et al. | |
| 8,080,994 B2 | 12/2011 | Taylor et al. | |
| 8,896,295 B2 | 11/2014 | Friedrich et al. | |
| 8,907,437 B2 | 12/2014 | Milano et al. | |
| 9,007,054 B2 | 4/2015 | Friedrich et al. | |
| 9,081,041 B2 | 7/2015 | Friedrich et al. | |
| 9,214,884 B2 | 12/2015 | Sonoda et al. | |
| 10,520,559 B2* | 12/2019 | Cesaretti | G01R 33/0029 |
| 10,955,306 B2* | 3/2021 | Cadugan | G01L 19/0092 |
| 2004/0080308 A1 | 4/2004 | Goto | |

(Continued)

FOREIGN PATENT DOCUMENTS

| | | | |
|---|---|---|---|
| JP | 2000-174357 A | 6/2000 |
| JP | 2001-221815 A | 8/2001 |

(Continued)

OTHER PUBLICATIONS

U.S. Appl. No. 17/208,093, filed Mar. 22, 2021, McNally, et al.

*Primary Examiner* — Daniel C Puentes
*Assistant Examiner* — Khareem E Almo
(74) *Attorney, Agent, or Firm* — Daly Crowley Mofford & Durkee, LLP

(57) ABSTRACT

Methods and apparatus for measuring a current difference between at least two current traces in a circuit board. Each wire or trace generates a magnetic field which may then be measured by at least one magnetic field sensing element positioned on an integrated circuit, such as a current sensor integrated circuit or a differential magnetic field sensor integrated circuit. An output disconnect signal may be provided from the current sensor or differential magnetic field sensing integrated circuit to indicate that a current difference above a predetermined threshold exists in the two or more current traces.

29 Claims, 5 Drawing Sheets

(56) References Cited

U.S. PATENT DOCUMENTS

| | | | |
|---|---|---|---|
| 2006/0219436 A1* | 10/2006 | Taylor | H01L 24/73 |
| | | | 174/529 |
| 2010/0156394 A1* | 6/2010 | Ausserlechner | G01R 19/0092 |
| | | | 324/144 |
| 2011/0234215 A1* | 9/2011 | Ausserlechner | G01R 33/0047 |
| | | | 324/244 |
| 2014/0266180 A1* | 9/2014 | Ausserlechner | G01R 15/205 |
| | | | 324/251 |
| 2018/0238711 A1* | 8/2018 | Zimmer | G01D 5/145 |
| 2018/0321282 A1* | 11/2018 | Hurwitz | G01R 15/207 |
| 2020/0132728 A1* | 4/2020 | Bou | H01L 43/04 |
| 2021/0033424 A1* | 2/2021 | Cadugan | G01R 33/093 |
| 2021/0223292 A1* | 7/2021 | Liu | H01L 43/04 |
| 2021/0311136 A1* | 10/2021 | Augendre | G01R 33/09 |

FOREIGN PATENT DOCUMENTS

| | | |
|---|---|---|
| JP | 2001-339109 A | 12/2001 |
| JP | 2002-040058 A | 2/2002 |
| JP | 2002-202326 A | 7/2002 |
| JP | 2002-202327 A | 7/2002 |

* cited by examiner

DIFFERENTIAL CURRENT SENSOR

BACKGROUND

Some conventional current sensors are positioned near a current-carrying conductor to sense a magnetic field generated by a current through the conductor. The current sensor generates an output signal having a magnitude proportional to the magnetic field induced by the current through the conductor.

Some current sensors, such as a ground fault interrupt (GFI) current sensor, are configured to look for small differences in current, typically less than 0.01% of full scale or less than 25 mA, between two conductors. Having a current sensor which can effectively determine when a difference exits between two conductors can be challenging.

SUMMARY

Example embodiments of the disclosure provide methods and apparatus for sensing a current between two or more conductors, or wires, such as a current sensor or a differential magnetic field sensor. In embodiments, as current in a first conductor generates a first magnetic field, and a second current generates a second magnetic field, the difference of these two magnetic fields is compared to a threshold for providing an output to indicate a difference between the first and second currents above a predetermined level.

In one architecture, the first and second conductors may be conductive traces on a printed circuit board or hybrid circuit. The current sensor may be positioned above the two conductive traces on the circuit board or hybrid circuit.

The current sensor may contain one or more magnetic field sensing elements, which may comprise a planar Hall element, a vertical Hall element, or a magnetoresistance element, such as a giant magnetoresistance element (GMR), a tunneling magnetoresistance element (TMR) or a magnetic tunnel junction (MTJ), or a combination of magnetic field sensing elements. In an embodiment that uses more than one magnetic field sensing element, at least two magnetic field sensing elements may have an axis of maximum sensitivity configured in the order of about 180 degrees from each other.

The current sensor may contain a current calculation circuit on the integrated current sensor die to calculate the current flowing in the conductive traces, or wires, as the measured value of the magnetic field combination from the two wire, or positioned so that the current in each wire is measured independently. In embodiments, a disconnect output signal may be generated by the current calculation circuit and provided as an output of the current sensor integrated circuit. In embodiments the output disconnect signal may be activated by a current difference between the two conductors of approximately 10%, 20%, or more.

A current sensor or differential Hall sensor can be positioned near first and second conductive wires, or traces on printed circuit board or hybrid circuit, to compare the current in the two conductors by measuring the magnetic field generated by the two conductors, either as one measurement or a combination of measuring the two currents independently. An output disconnect signal from the current sensor or the differential Hall sensor can correspond to the current comparison.

A method may use one or more magnetic field sensing elements to measure the current in the conductive traces. The magnetic field sensing elements may comprise a planar Hall element, a vertical Hall element, or a magnetoresistance element, such as a giant magnetoresistance element (GMR), a tunneling magnetoresistance element (TMR) or magnetic tunnel junction (MTJ), or a combination of magnetic field sensing elements. In an embodiment that uses more than one magnetic field sensing element, at least two magnetic field sensing elements may have an axis of maximum sensitivity configured 180 degrees from each other.

The method to provide a output disconnect signal from the current sensor or differential Hall sensor integrated circuit may contain a current calculation circuit on the integrated current sensor die to calculate the current flowing in the conductive traces, or wires as the measured value of the magnetic field combination from the two wire, or positioned so that the current in each wire is measured independently. In embodiments, a disconnect output signal may be generated by the current calculation circuit and provided as an output of the current sensor integrated circuit. The method may provide an output disconnect signal activated by a current difference between the two conductors of approximately 10%, 20%, or more. The method may be used to detect a ground or reference voltage disconnect in a motor.

DETAILED DESCRIPTION

Figure 1:
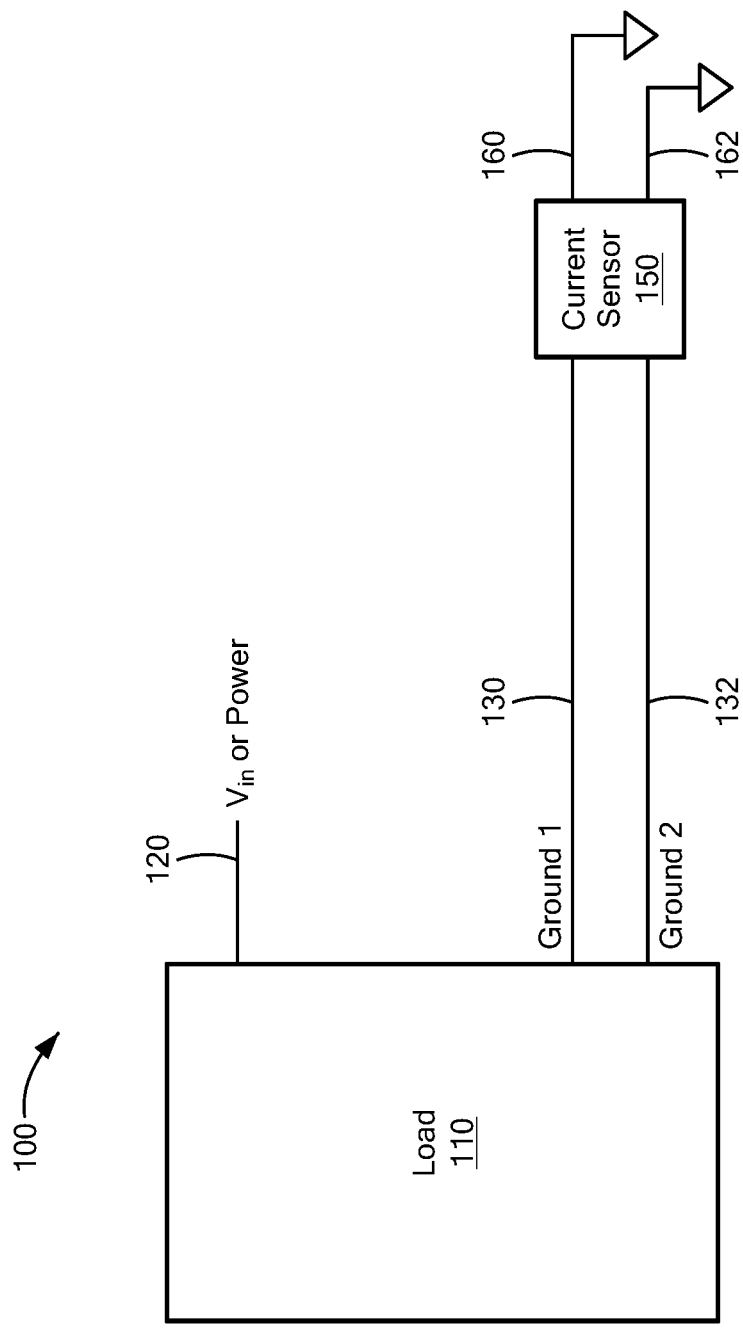
FIG. 1 shows a current sensor system with a current sensor IC package.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half-bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" or "controller" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but will be readily understood by one of ordinary skill in the art.

In particular, it should be understood that a so-called comparator can comprise an analog comparator having a two state output signal indicative of an input signal being above or below a threshold level (or indicative of one input signal being above or below another input signal). However, the comparator can also comprise a digital circuit having an output signal with at least two states indicative of an input signal being above or below a threshold level (or indicative of one input signal being above or below another input signal), respectively, or a digital value above or below a digital threshold value (or another digital value), respectively.

FIG. 1 shows a current sensing system 100 for sensing a current in a load 110 such as a motor, LED light, string of lights, or other electrical circuit for which it is desired to measure current. The load 110 has a voltage input Vin and/or power input 120. In embodiments, the load 110 has a first ground wire 130 for a first ground (ground 1) and a second ground wire 132 for a second ground (ground 2). In embodiments, ground 1 and/or ground 2 may comprise traces on a circuit board. A current sensor 150 may be positioned near the first and second ground wires/conductors 130, 132. On the other side of the current sensor 150, the electrical conductors 130, 132 are connected to ground or other reference voltage potential through conductors, traces, or wires 160, 162. It is understood that in example embodiments the current sensor 150 is placed proximate the current-carrying conductors 130, 132, but does not contact or interrupt the conductors.

In another embodiment the current sensor 150 may be replaced with a differential Hall sensor, as the conductors are outside of the current sensor integrated circuit package.

In a motor application, including AC or DC motor applications, it may be desirable to know when there is a current mismatch between the two ground wires 130, 132. In some motor applications this mismatch may be above what may be observed in a typical ground fault interrupt circuit (GFI). As such, the use of a GFI current sensing system would indicate a problem where a problem may not exist in a motor application. For example, in some cases, the current may be 55% to 75% in one current path or ground wire and 25% to 45% in the other current path or ground wire. For example, in some cases the current in ground wires may be split up to 70% in one and 30% in another current path and this would not be a reason for a flag or problem indicator. In another case the current may be acceptable at between 40-60% in each ground wire or current path. These current differences may be greater than 100 mA or larger, for example, a current difference may be greater than 1A or 2A in certain applications. A conventional GFI type of current sensor may not allow the motor to remain operational with these differences in current, as the GFI would typically trip below 25 mA.

Figure 2:
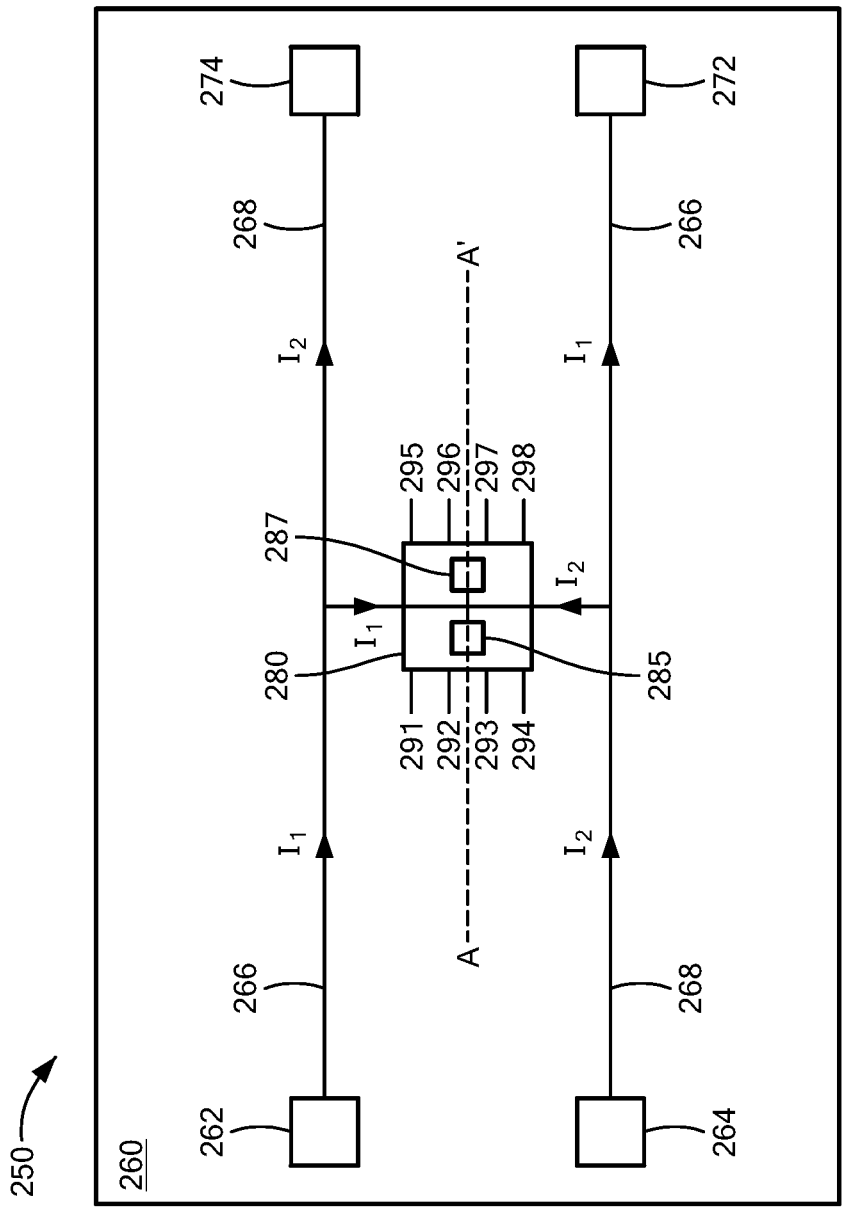
FIG. 2. Is a top view of a current sensor integrated circuit package mounted on a printed circuit board.

FIG. 2 provides an example of a portion of the current sensing system 100 shown in FIG. 1. In embodiments, a current sensing system 250 includes a circuit board 260 upon which a current sensor integrated circuit (current sensor IC) 280 is mounted. Input electrical connection points 262, 264 may be in the form of a bonding pad, an electrical connector or other terminal, including but not limited to a separate wire soldered to each of circuit board connection points 262, 264. Current traces 266, 268 may be patterned on the circuit board, or a hybrid circuit. Output electrical connection points 272, 274 may be provided on the circuit board. In embodiments, the current traces 266, 268 are patterned such that they generate current flow in opposite directions near the current sensor integrated circuit. A first current, $I_1$, flows into electrical connection point 262 through current trace 266 and out of electrical connection point 272. A second current, $I_2$, flows into electrical connection point 264 through current trace 268 and out of electrical connection point 274. In one embodiment the current traces 266, 268 are positioned on top of one another in the vicinity of the current sensor 280, which will be described further in relation to FIG. 2A.

In the illustrated embodiment, the current sensor 280 has eight leads 291, 292, 293, 294, 295, 296, 297, and 298. These leads contain power input, ground leads, output pins, and other functions that may be desired for a current sensor. One lead may be an overcurrent pin and/or a current mismatch pin. The current mismatch pin may provide an indication of the current flowing in. As shown, current sensor 280 may be a packaged integrated circuit with two Hall plates, 285, 287, or other magnetic field sensing elements. In the case of planar Hall elements, the first and second Hall elements, or Hall plates, for example, are positioned on opposite sides of the current traces 266, 268.

The electrical current flowing through the current traces 266, 268 produces magnetic fields which are in opposite directions in FIG. 2 in the area of the current sensor IC 280. If the two currents are of the same magnitude but in opposite directions the net sum of magnetic field sensed by the Hall plates 285, 287 is near zero. The actual net magnetic field will depend on the dimensions of the system and the exact position of the magnetic field sensing elements, 285, 287, e.g., two Hall plates, and the vertical distance between the first and second traces 266, 268. Where the two Hall plates have the same positive sensitivity axis, for example both Hall plates produce a positive voltage for a magnetic field sensed out of the surface of the integrated circuit die.

Figure 2A:
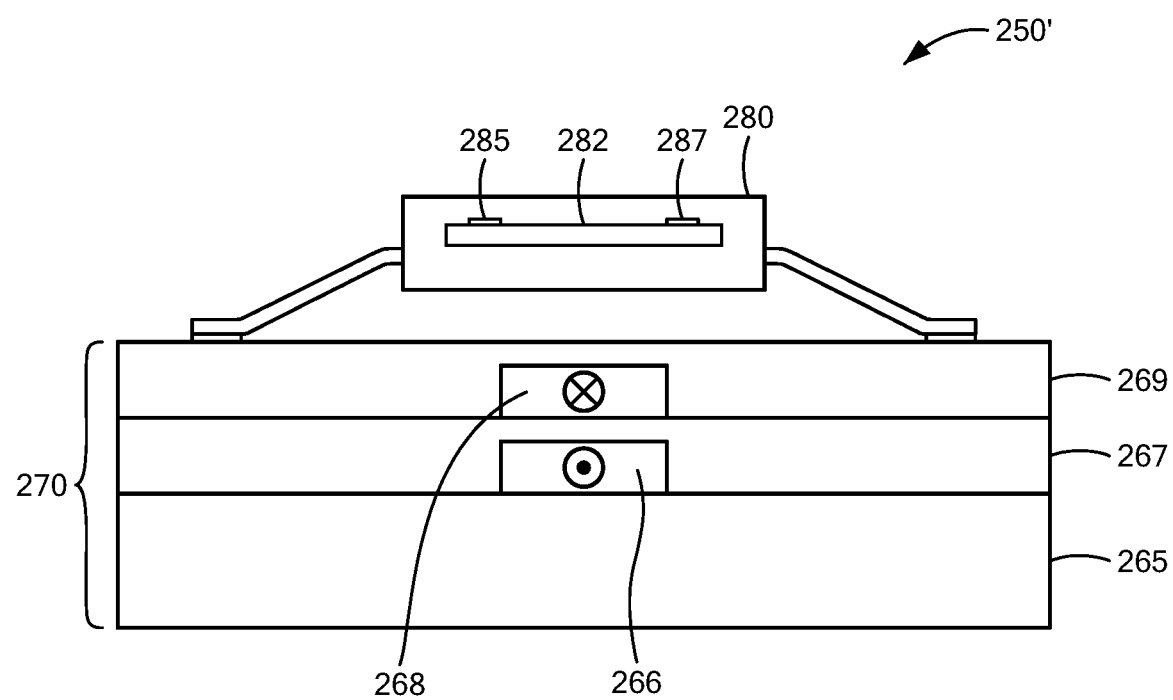
FIG. 2A is a side of a current sensor integrated circuit package mounted on a printed circuit board.

FIG. 2A provides a side view of FIG. 2 in the region of the current sensor IC. Current sensor system 250' shows the current sensor IC 280 with an integrated circuit die 282. The current sensor IC 280 is mounted to a circuit board 270. Internal leadframe connections of the current sensor IC 280 are not shown for clarity. The internal connections of the current sensor IC 280 may include a flip-chip assembly, a typical die on leadframe with wire bond assembly, a lead on chip assembly, or the like. In the illustrated embodiment, current traces 266, 268 are positioned in or on the circuit board 270. In one example, the circuit board 270 includes a substrate 265 upon which a current trace 266 is patterned. An insulating layer 267 is placed between current trace 266 and current trace 268. A final insulating layer 269 may be provided to insulate the current trace 268 from any connections, which are not shown for clarity, to the current sensor IC 280. Other electrical traces and connections may be part of the circuit board 270. They may include, but are not limited to, connections to the current sensor IC 280 on an additional metal layer or layers. In other embodiments the connection to the current sensor IC 280 may be made with conductor layers on the same level as traces 266 or 268.

In other embodiments, other types of magnetic field sensing elements may be used. The position of the sensing elements may be moved without departing from the scope of the claimed invention in order to place the magnetic field sensing elements in a position where they can sense the magnetic field. For example, a vertical Hall or giant magnetoresistive (gmr) or other magnetoresistive element (MR) embodiment may have the elements above the current traces 266, 268.

The position of the conductors, 266, 268 may also be changed to be next to each other rather than on top of each other as shown in FIG. 2A. In one example the Hall plates 285, 287 may be positioned on the same plane of the circuit board. In such a case field measured by the Hall plates may not cancel to zero.

In another embodiment current traces on the circuit board may be removed and replaced with wires that connect the motor to a ground or reference voltage in a system directly. In such a case a circuit board may contain the integrated current sensor package, or die, 280 and have the ground wires from the motor positioned near the current sensor IC with an epoxy attach, tape attach, glue, or mechanical fixture to place the wires or a wiring harness.

In other embodiments, each current trace or wire may be replaced by more than one current trace or wire. For example, two wires or traces may be represented by ground line 130 and two traces or wires may be represented by ground line 132 in FIG. 1. Other numbers of wires or traces are also possible without departing from the teachings of the present invention.

Figure 3:
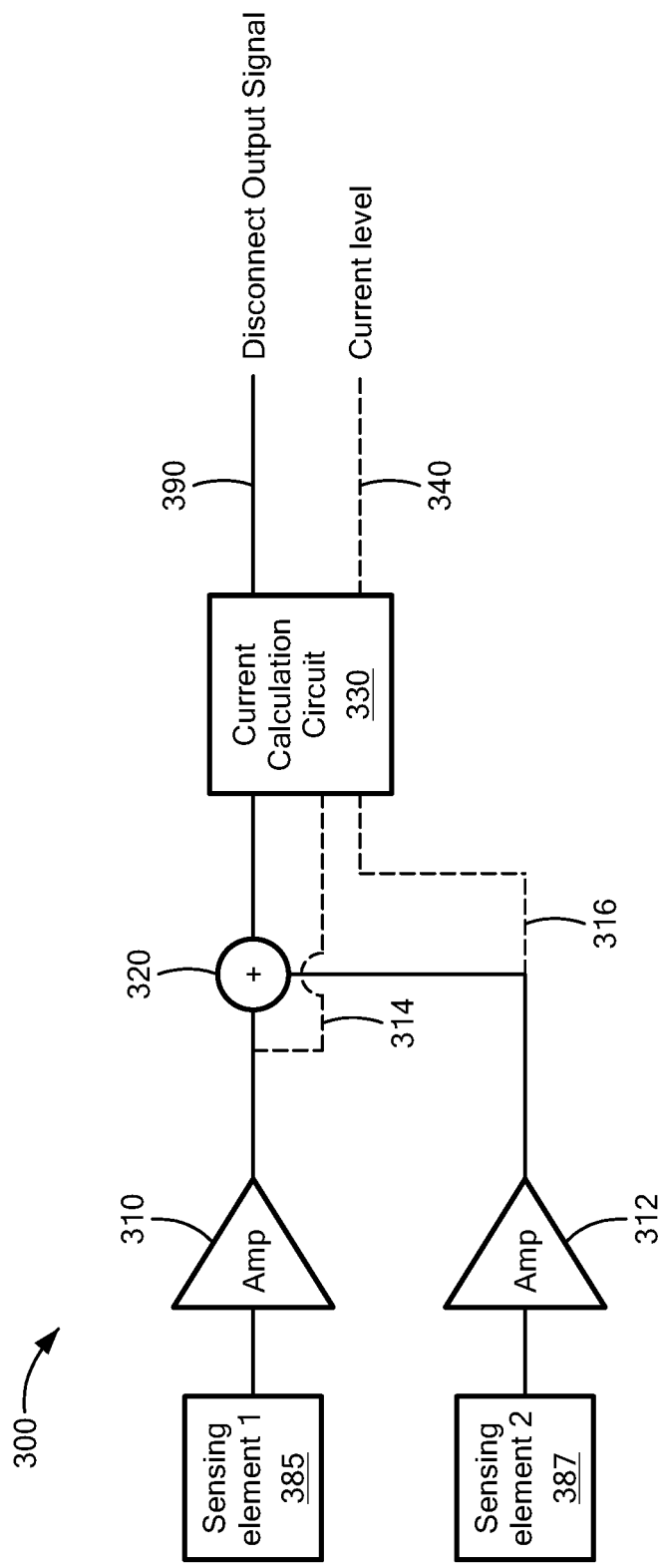
FIG. 3 is a schematic overview of a circuit for use in the current sensor integrated circuit.

FIG. 3 provides an example of a current mismatch circuit 300 that may form part of a current sensor integrated circuit. In example embodiments, current mismatch circuit 300 includes first and second magnetic field sensing elements 385, 387. In an embodiment, the first magnetic field sensing element 385 and the second magnetic field sensing element 387, may comprise planar Hall plates. The magnetic field sensing elements 385, 387, are connected to first and second amplifiers 310, 312 respectively. The output of the amplifiers 310, 312 may be summed in a summing element 320. The sum of the two magnetic field sensing elements 385, 387 is input to a current calculation circuit 330, which may include a comparator to compare a difference (or sum) of the measured magnetic fields detected by magnetic field sensing elements 385, 387. The threshold of the comparator in the current calculation circuit 330 may be programmable, such as by the manufacturer or customer. The current calculation circuit 330 provides a disconnect output signal 390 that may go to a pin or lead on the current sensor IC.

In another embodiment, the output of the current calculation circuit 330 may be provided to an output circuit as part of the current sensor IC circuit. An output circuit in the current sensor IC circuit may allow output in the form of a SENT, I²C, or other output format including changing the outputs on pins at a defined clock frequency.

FIG. 3 also shows an alternative set of connections 314, 316, 340 in dotted lines. The magnetic field level from the first sensing element 385, may be provided to the current calculation circuit 330. The magnetic field level from the second sensing element 387 may be provided to the current calculation circuit 330. The signals on the traces 314, 316 may be used to calculate the current in each line to be sensed, for example 266, 268 on FIG. 2. The current calculation may be output on for example on pins, lines, or traces 340. In other embodiments, the current in each trace 266, 268 in FIG. 2 and the sum of the two currents may be output. In some embodiments the trace 340 may be expanded into three output pins, lines, or traces, so the current in each of the two writes to be measured can be output, as well as the sum of the current in the two traces. Other outputs such as a disconnect output signal may also be present on additional output pins, leads, or traces. Multiple outputs may be combined on one pin, lead or trace as described above with the use of an output protocol.

In another embodiment the direction of the current in a conductor, or the position of the conductor may result in a sum of the two Hall plates 385, 387 becoming a difference, for example if the two wires or conductors have current flowing in the same direction. In such a case it may be desirable to change the polarity, or the positive output voltage orientation, of one of the Hall plates. In such a case one Hall plate would provide a positive Hall voltage, for example Hall plate 385, for a magnetic field out of the plane of the integrated circuit die, and Hall plate 387 would provide a negative Hall voltage for a magnetic field out of the plane of the integrated circuit die.

In another embodiment, a current sensor integrated circuit die is mounted to a PC board without a package. This may use technics including, but not limited to, flip-chip attachment, and a chip and wire boding to the circuit board, or other support substrate, or flexible circuit.

Figure 4:
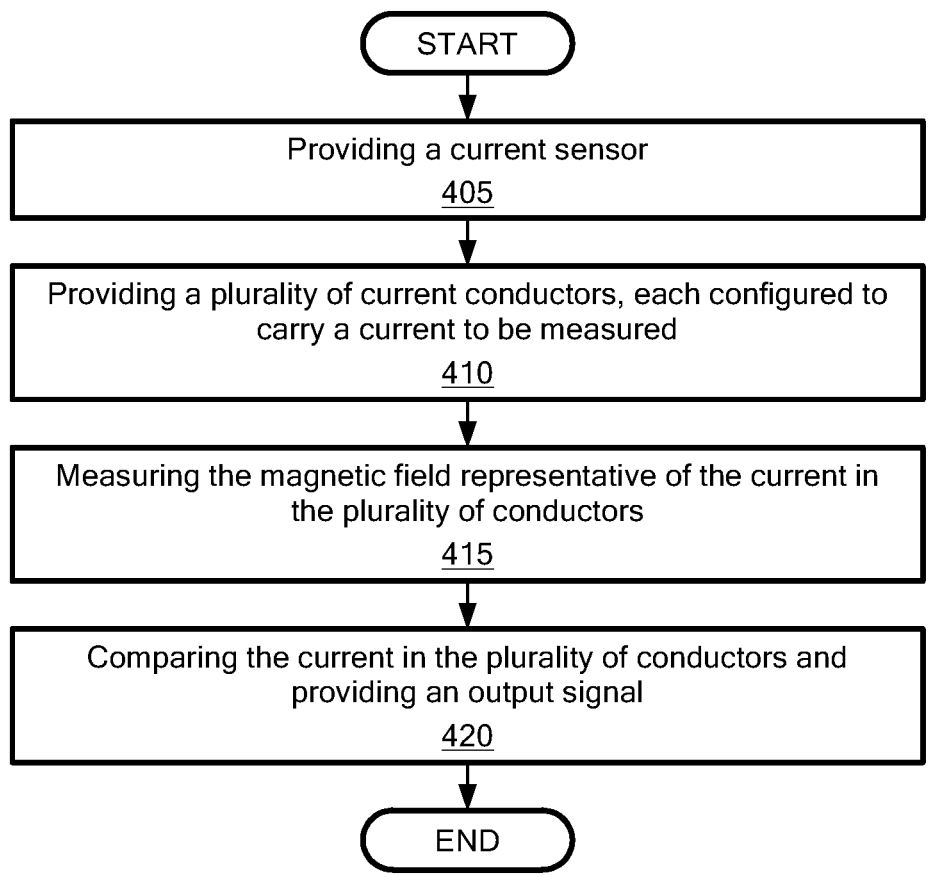
FIG. 4 is a flow diagram of a method for determining a current difference between a plurality of conductors in the current sensor system.

Referring to FIG. 4, a method for determining a current difference between a plurality of conductors in the current sensor system (e.g., system 100, 250) begins at block 405 by providing a current sensor or differential Hall sensor (e.g., current sensor 150, current sensor integrated circuit 280). At block 410, plurality of conductors (e.g., 266, 268) are provided, each of the conductors carrying a current to be measured.

At block 415, the magnetic field generated by the current in the plurality of conductors is measured. Block 420 compares the current measurement in the plurality of conductors and provides a disconnect output signal.

It is understood that any of the above-described processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., RAM/ROM, CD-ROM, hard disk, or magnetic diskette) that is readable by a general or special purpose programmable computer for configuring and operating the computer when the storage medium or device is read by the computer.

Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array), and/or an ASIC (application-specific integrated circuit)).

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A current sensing system comprising: a current sensor integrated circuit package comprising: a die; a first magnetic field sensing element in the current sensor integrated circuit package; a package body; and at least two electrical leads extending from the package body; a printed circuit board comprising a first conductive trace on a first layer of the printed circuit board, a second conductive trace on a second layer of the printed circuit board, and an insulator layer between the first conductive trace and the second conductive trace; and a current calculation circuit disposed on the current sensor integrated circuit die to generate a disconnect output signal based on a difference between the current flowing in the first conductive trace and the second conductive trace, wherein the disconnect output signal is asserted when the difference is greater than a programmable threshold.

2. The current sensing system of claim 1 wherein the first conductive trace is positioned under the current sensor integrated circuit, and the second conductive trace is positioned between the current sensor integrated circuit package and the first conductive trace.

3. The current sensing system of claim 1, wherein the current sensor integrated circuit package further includes a second magnetic sensing element.

4. The current sensing system of claim 3 wherein the first and second magnetic field sensing elements have respective sensitivity response axes arranged approximately 180 degrees from each other.

5. The current sensing system of claim 1 wherein the disconnect output signal is configured to be active when the respective currents in the first conductive trace and the second conductive trace are different by at least 10%.

6. The current sensing system of claim 1 wherein the disconnect output signal is configured to be active when the respective currents in the first conductive trace and the second conductive trace are different by at least 20%.

7. The current sensing system of claim 1 wherein the magnetic field sensing element comprises a Hall Effect element and/or a magnetoresistance element.

8. The current sensing system of claim 7 wherein the Hall Effect element comprises a planar Hall Effect element or a vertical Hall Effect element.

9. The current sensing system of claim 7 wherein the magnetoresistance element is selected from the group consisting of a semiconductor magnetoresistance element, an anisotropic magnetoresistance element (AMR), a giant magnetoresistance element (gmr), and a tunneling magnetoresistance element (TMR).

10. The current sensing system of claim 3 wherein the second magnetic field sensing element comprises one of a Hall Effect element and/or a magnetoresistance element.

11. The current sensing system of claim 10 wherein the Hall Effect element comprises a planar Hall Effect element and/or a vertical Hall Effect element.

12. The current sensing system of claim 10 wherein the magnetoresistance element comprises a semiconductor magnetoresistance element, an anisotropic magnetoresistance element (AMR), a giant magnetoresistance element (gmr), and/or a tunneling magnetoresistance element (TMR).

13. A method of sensing a current in a system comprising:
arranging a current sensor integrated circuit having a first magnetic field sensing element in a current sensor integrated circuit package with respect to a circuit board, wherein the circuit board comprises a first conductive trace on a first layer of the circuit board, a second conductive trace on a second layer of a circuit board, and an insulator layer between the first and second conductive traces;

measuring a magnetic field representative of a combination of a first current in the first conductive trace and a second current in the second conductive trace flowing in opposite directions near the current sensor integrated circuit;

comparing current flowing in the first conductive trace and the second conductive trace, and;

providing a disconnect output signal of the current sensor integrated circuit based on the comparison of the currents in the first and second conductive traces.

14. The method according to claim 13 further comprising: providing a second magnetic sensing element in the current sensor integrated circuit.

15. The method according to claim 14 wherein the first and second magnetic field sensing elements have respective sensitivity response axes arranged approximately 180 degrees from each other.

16. The method of according to claim 13 wherein the disconnect output signal transitions when the current in the first conductive trace and the second conductive trace are different by at least 10%.

17. The method according to claim 13 wherein the disconnect output signal transitions when the currents in the first conductive trace and the second conductive trace are different by at least 20%.

18. The method according to claim 13 wherein the magnetic field sensing element comprises one of a Hall Effect element, or a magnetoresistance element.

19. The method according to claim 18, wherein the Hall Effect element is a planar Hall Effect element, or a vertical Hall Effect element.

20. The method according to claim 18 wherein the magnetoresistance element is selected from one of a semiconductor magnetoresistance element, an anisotropic magnetoresistance element (AMR), a giant magnetoresistance element (gmr), or a tunneling magnetoresistance element (TMR).

21. The method of claim 13, wherein the comparing current flowing in the first conductive trace and the second conductive trace comprises employing a current calculation circuit disposed on a die of the current sensor integrated circuit.

22. A method of sensing a current in a system comprising:

arranging a current sensor integrated circuit with a first magnetic field sensing element in a current sensor integrated circuit, measuring a magnetic field representative of a combination of a first current in a first conductive wire and a second current in a second conductive wire flowing in opposite directions near the current sensor integrated circuit, comparing current flowing in the first conductive wire and the second conductive wire, and;

providing a disconnect output signal of the current sensor integrated circuit.

23. A method according to claim 22, wherein the output disconnect signal indicates a current difference in a ground return from an electric motor.

24. The method according to claim 23 wherein the disconnect output signal transitions when the currents in the first conductive trace and the second conductive trace are different by at least 10%.

25. The method according to claim 23 wherein the disconnect output signal is provided when the current in the first conductive trace and the second conductive trace are different by at least 20%.

26. The method according to claim 22 wherein the first magnetic field sensing element comprises one of a Hall Effect element, or a magnetoresistance element.

27. The method according to claim 26 wherein the Hall Effect element is a planar Hall Effect element, or a vertical Hall Effect element.

28. The method according to claim 26 wherein the magnetoresistance element is selected from one of a semiconductor magnetoresistance element, an anisotropic magnetoresistance element (AMR), a giant magnetoresistance element (gmr), or a tunneling magnetoresistance element (TMR).

29. The method according to claim 21, wherein the comparing current flowing in the first conductive trace and the second conductive trace comprises employing a current calculation circuit disposed on a die of the current sensor integrated circuit.

* * * * *